United States Patent [19]

Sobhani

[11] Patent Number: 5,213,511

[45] Date of Patent: May 25, 1993

[54] DIMPLE INTERCONNECT FOR FLAT CABLES AND PRINTED WIRING BOARDS

[75] Inventor: Mohi Sobhani, Encino, Calif.

[73] Assignee: Hughes Aircraft Company, Los Angeles, Calif.

[21] Appl. No.: 858,473

[22] Filed: Mar. 27, 1992

[51] Int. Cl.⁵ .............................................. H01R 9/09
[52] U.S. Cl. ....................................... 439/67; 439/77; 439/329; 439/492
[58] Field of Search ................ 439/67, 77, 329, 492, 439/493, 499, 883

[56] References Cited

U.S. PATENT DOCUMENTS 4,403,272  9/1983  Larson et al. .
4,850,883  7/1989  Kobadi ........................... 439/329
5,097,101  3/1992  Trobough ........................ 439/67
5,121,299  6/1992  Frankeny et al. ................ 439/74

Primary Examiner—Paula A. Bradley
Attorney, Agent, or Firm—M. E. Lachman; M. W. Sales; W. K. Denson-Low

[57] ABSTRACT

An electrical connector assembly (10) comprises first and second electrical connectors (12 and 14) and/or a printed wiring board (70) having electrical conductors thereon ending in termini (32, 34). Dimples (36, 38 and/or 72) are provided on the termini and provide connections between the flex cables or a flex cable and the printed wiring board. The dimples also provide self-alignment between the matable electrical connectors.

9 Claims, 3 Drawing Sheets

DIMPLE INTERCONNECT FOR FLAT CABLES AND PRINTED WIRING BOARDS

BACKGROUND OF THE INVENTION

1. Field of the Invention

The present invention relates to apparatus and method for forming an electrical connector assembly and, in particular, to the use of pairs of mating dimples as the coupling medium.

2. Description of Related Art and Other Considerations

While technological improvements in the design and performance of electrical components and systems have been greatly heralded, one of the most common and recurring problems associated with such components and systems is the failure to obtain electrical connections which are reliable and secure. Therefore, such advanced technologies become useless in the absence of a suitable and practical means of interconnections.

Specifically, complex subassemblies interconnecting thousands of integrated circuits and small devices must be repairable, accessible and interchangeable for cost effectiveness. Multilayer printed circuit board assemblies with fine lines and high speed devices can no longer be interconnected with available microconnectors.

Conventionally, solder connections have been used many times in place of non-solder type interconnections. However, ordinary solder attached type connectors with fine pitch have inherent problems, such as cold solder, the ability to be inspected, connect/disconnect capabilities, alignment, and difficulties with installation on large input/output with fine lines. They are difficult to inspect for reliability and, therefore, have less than adequate reliability. They are further difficult to repeatedly connect and disconnect. In addition, ordinary solder attached connectors are becoming obsolete due to their pin limitation, volume and weight.

Therefore, non-solder type interconnections have been reconsidered. An interconnection mechanism involving no solder or weld is very desirable so long as it provides low weight, volume and high reliability at lower cost. Such non-solder or weld interconnection mechanisms must fulfill all the positive features of micro-connectors, must withstand harsh environments such as shock, large temperature excursions and vibration, and must be cost effective within design constraints.

Nevertheless, even with present high technology mechanical interconnection mechanisms and systems, there still remains a large problem in maintaining reliable interconnections.

According to the October 1988 issue of *Electronic Packaging & Production*, seven of the eighteen F-111 aircraft sent on the U.S. mission in Libya were forced to turn back because of avionics problems traced to connector malfunctions. The smallest misalignment of connector plates and trays, coupled with vibration of the aircraft, were major reasons for avionic failures, even though many of these systems incorporating the malfunctioning connectors later checked out as "good" once they were removed from the aircraft and tested.

Present multichip modules comprising VLSI (very large-scale integration), TAB (tape automated bonding) and Chip-On-Board devices offer lower component package cost, lower weight/profile, greater density, improved reliability, improved electrical performance and greater design flexibility, etc. By themselves, they are useful components without suitable means of interconnections.

Various industry surveys show that over 150 electronics manufacturers throughout the world have launched nearly 500 Tape Automated Bonding (TAB) projects in either pilot projects or full production in the past 2 years. In Japan, most consumer electronics applications use TAB because of all the known advantages which TAB offers. The main motivation for its use is the requirement to interconnect devices with more than 100 input and output (I/O) terminals, and to pre-test and burn-in VLSI chips for higher reliability and lower life-cycle costs. Most high density multichip packages require the use of multilayer substrates with fine lines, high-speed connections, and a high number of I/O terminals. The basic substrate is made of flat alumina ceramic with Tungsten-metalized inner layers for power and ground with precious metal layers. TAB is an advanced packaging technique that enjoys a number of advantages compared to conventional techniques, including faster production throughput, high reliability, lower costs and improved yields.

To fully realize the benefits of TAB, Chip-On-Board, VLSI, Surface Mounted integrated circuits and Hybrids, the interconnection process itself must be carefully examined and meticulously analyzed not only from technical, reliability, maintainability, test and qualification standpoints, but also from cost and technology related compatibility factors.

Small surface mounted components are particularly susceptible to heat damage and improper soldering and handling techniques.

Historically, connector related technology is far behind development in other devices such as integrated circuit technology. The reason for this is that most new devices are tested in research and development (R & D) laboratories after bread-boarding and debugging. Most devices are interconnected with ready made printed wiring boards, regular type connectors and bundles of wires soldered to the board or device leads. During this period of device development, the connector industry is unaware of, or cannot afford to keep up with higher density, high count I/O terminals, high-speed and other improvements that is required by the new and sophisticated technology/component development. This lag is always felt by most packaging engineers and designers. For the most part, after they have conducted exhaustive literature searches and catalog requests from various known connector vendors, a set of connectors is selected for the project, with size availability, delivery and cost as the main factors for selection. This process is dictated by the designer with the factor of availability being at the forefront of all other considerations. However, while the connector selection process is still being conducted, most of the other items in the design, such as chassis, motherboard guides and accessories, are configured and going through the design completion phase. This delay in selection leaves a very limited schedule and funding for connector development.

In recent months, because of Chip-On-Board, ASIC (application specific integrated circuit), VHLSI (very high large scale integration), TAB (tape automated bonding) and multichip module technologies, many projects including large connector companies are putting research and development (R&D) effort in solving design problems associated with subassembly interconnections. Under this condition and due to high I/O count, the solderless interconnection system is becoming more attractive.

The printed circuit board industry continues to provide the basic building blocks of the electronic industry. Printed circuit boards in various forms, shapes, various number of layers and materials are today's space-saving command modules for thousands of electronic products such as computers, telecommunications equipment, automotive and appliance controls, radios and televisions as well as aerospace and defense electronics. A major change in packaging and interconnection technologies is taking place which will by-pass many limitations through surface mounting of components replacing the traditional dual-in-line packaging originally started in the sixties.

For all of these systems and components, reliable and low-cost interconnections, having repeatable connect and disconnect capabilities are needed.

SUMMARY OF THE INVENTION

These and other problems are successfully addressed and overcome by the present invention. Dimples on flexprints, when pressed against dimples on a similar flexprint or on a printed wiring board, provide the sole mechanical and electrical coupling between two or more subassemblies.

More specifically, an electrical connector assembly includes mating electrical connectors which are provided with matable, generally flat surfaces and electrical conductors terminating respectively on the surfaces. Dimples are formed at the conductor termini and are configured to provide an interconnection between their mating concave and convex surfaces to electrically couple the conductors. When each of the connectors comprise a plurality of conductors and dimples thereon, the mating dimples between the two conductors automatically provide self-alignment between the mating conductors.

Several advantages are derived from this arrangement. Primarily, the interconnection method has the advantages of being easy to provide repeated connections and disconnections between the connectors, a low profile appearance, low weight, low cost and accommodation of fine pitch, high count I/O subassemblies. Dimple interconnection involves low cost tooling and does not require special artwork. Transmission line impedance bumps inherent with multipin connectors are substantially eliminated. They are fully integrated and require no further assembly operations which incorporate, for example, eutectic type alloys. The dimple interconnection is applicable for use in such systems which contain high density, extremely fast, thermally hot subassemblies which are expected to perform more reliably at lower component cost and in which ordinary available connectors cannot be used. Special alignment devices, such as screws or mating posts and holes, of the prior art need not be employed.

Other aims and advantages, as well as a more complete understanding of the present invention, will appear from the following explanation of exemplary embodiments and the accompanying drawings thereof.

DETAILED DESCRIPTION OF THE PREFERRED EMBODIMENTS

Figure 1:
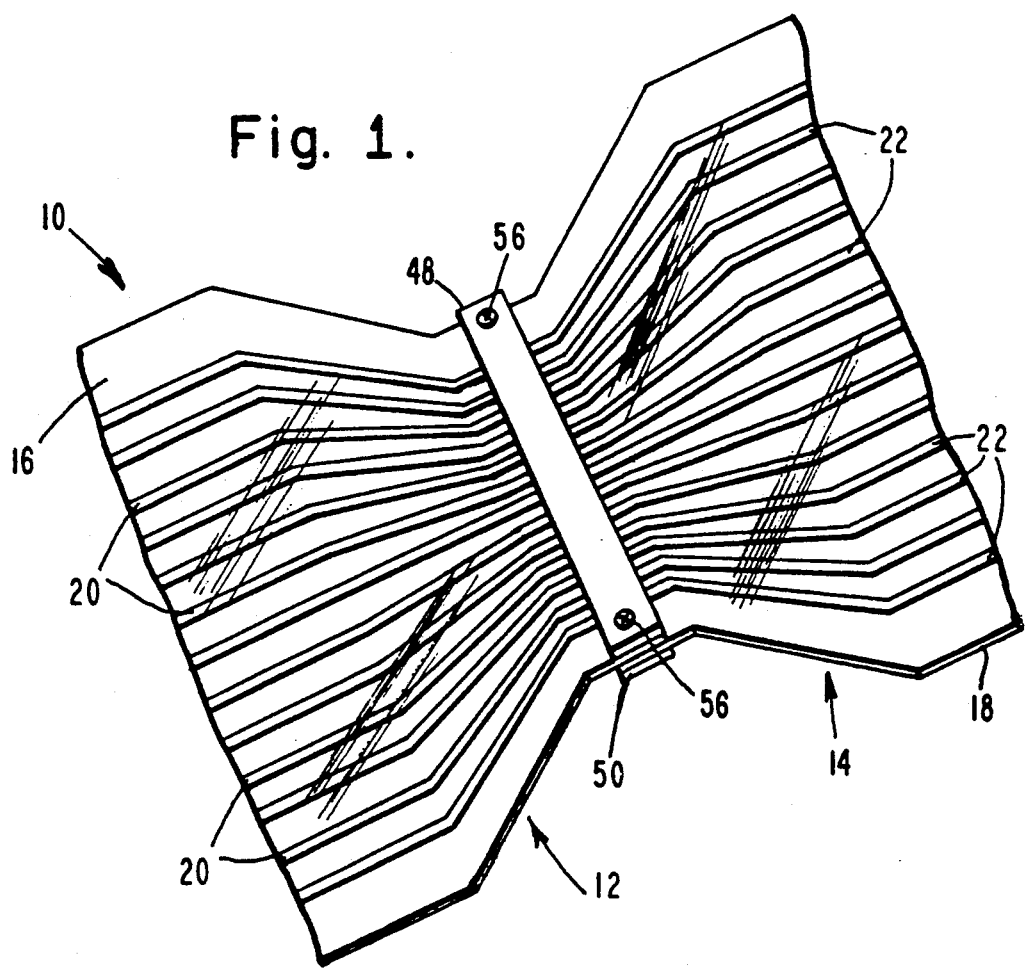
FIG. 1 is a view in perspective illustrating the present invention joining a pair of flexible flat cables.
Figure 2:
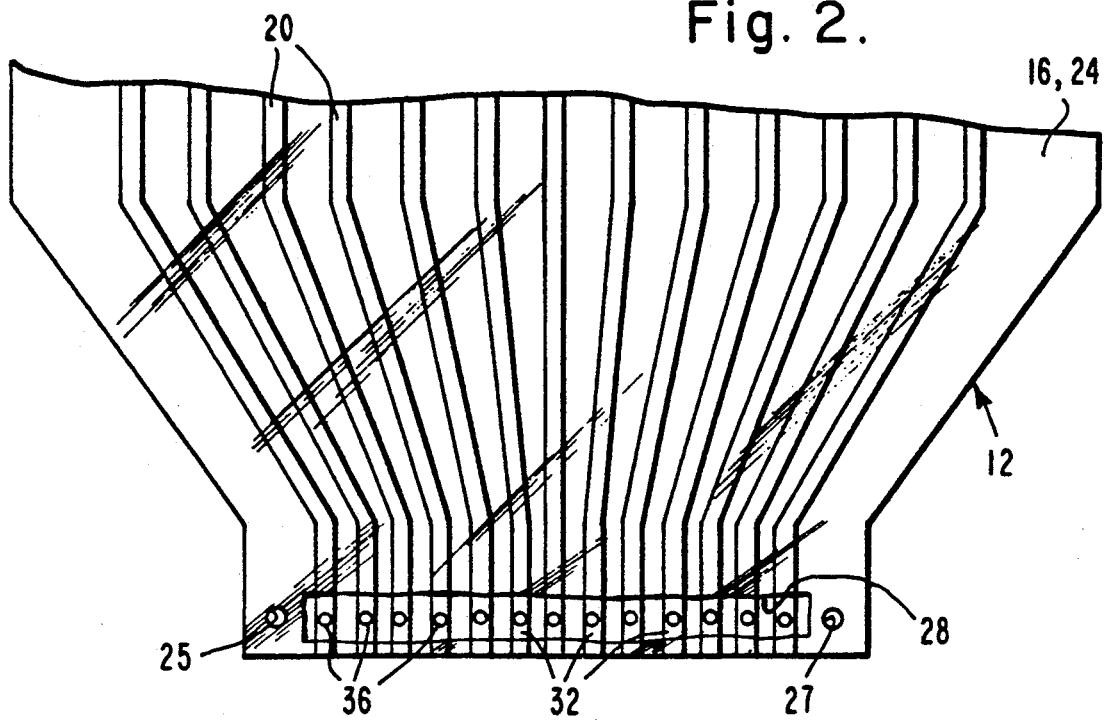
FIG. 2 is a plan view of one of the flat cables shown in FIG. 1.
Figure 3:
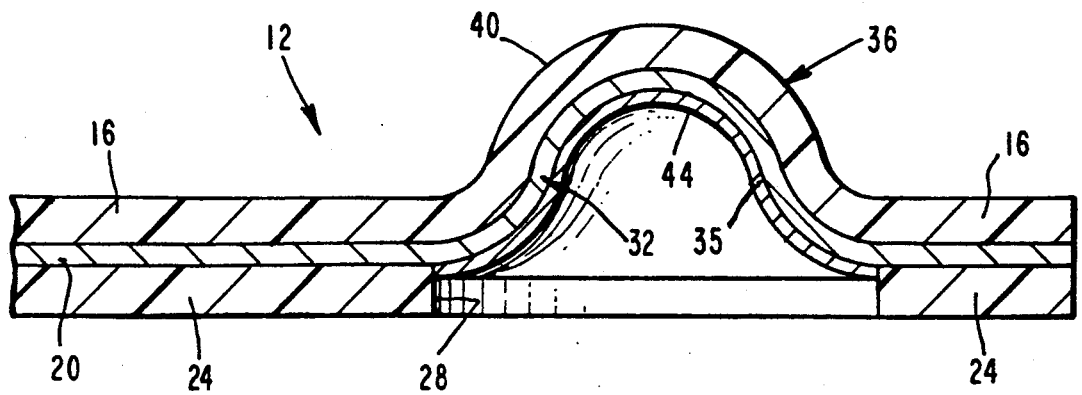
FIGS. 3 and 4 are enlarged views of the two flexible cables of FIG. 1 in cross-section, illustrating two of the cable areas and their mating dimples.
Figure 4:
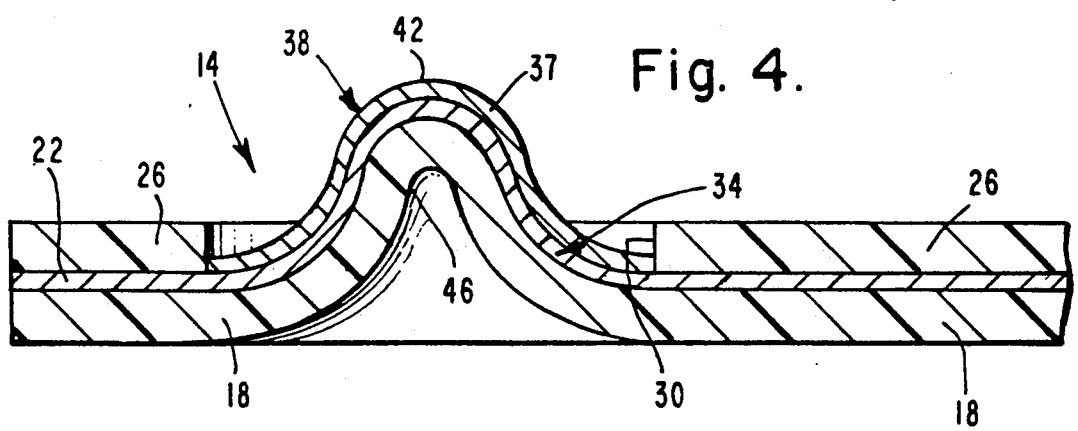

Referring to FIGS. 1-5, an electrical connector assembly 10 includes a pair of flat flexible cables 12 and 14. As shown in FIGS. 2-4, cables 12 and 14 are of conventional construction respectively comprising bases 16 and 18 of dielectric material, such as of Kapton polyimide, in which Kapton is a trademark of E.I. du Pont de Nemours & Co. Bases 16 and 18 are provided with a plurality of copper conductors 20 and 22 which are covered with protective, electrically insulative layers 24 and 26. Protective layers 24 and 26 may comprise a pressure sensitive material so that, when cables 12 and 14 are placed together, they will adhere to one another. However, this is not necessary and may be dispensed with. Pair of holes 25 and 27 are placed in respective cables 12 and 14 to facilitate their assembly.

Protective layers 24 and 26 are stripped away at areas 28 and 30 on respective cables 12 and 14 to expose termini 32 and 34 on respective conductors 20 and 22 on the two cables. Such termini have respective gold plates 35 and 37 thereon. At this point of their description, cables 12 and 14 are of conventional construction.

In accordance with the present invention, dimples 36 are formed on exposed termini 32 of flat flexible cable 12 and like dimples 38 are formed on exposed termini 34 of flat flexible cable 14. As best shown in FIGS. 3 and 4, dimples 36 and 38 have cup-shaped configurations, and are similarly shaped to provide convex portions 40 and 42 respectively of dimples 36 and 38 and concave portions 44 and 46 of respective dimples 36 and 38. The dimples are so similarly configured that convex portion 42 of dimple 38 fits closely within and conformably mates with concave portion 44 of dimple 36. While similarly configured, the dimples differ essentially in that their conductors 20 and 22 are provided on facing portions of the cables so that exposed termini 32 are positioned on concave portion 44 of dimple 36, and exposed termini 34 are positioned on convex portion 42 of dimple 38.

Dimples 36 and 38 may be formed in any convenient manner, such as by conventional punch and die processes. For example, conventionally made copper on Kapton flexible cables are placed so that their contact areas, such as areas 28 and 30, are individually placed between the male and female die halves. The dies are heated sufficiently to make the copper termini malleable so that, when the dye halves are pressed together, dimples are impressed into cable areas 28 and 30. The assembled die is then cooled to permit the copper to cool and to maintain the thus formed dimple shapes and, therefore, to provide the dimpled copper with a fixed dimple configuration. To form the two dimples 36 and 38, one of the cables is placed with the exposed copper facing the female half of the die and the other cable is positioned with the exposed copper facing the male half of the die. Otherwise, the technique for dimple formation is the same in both cases.

Cables 12 and 14 are coupled together between a pair of plates 48 and 50. Plates 48 and 50 are provided with holes 52 and 54 which are aligned with one another and with cable holes 25 and 27 to permit screws 56 to be inserted therethrough and for threaded engagement by nuts 58. Lock washers 60 are positioned between nuts 58 and bottom plate 50.

Figure 5:
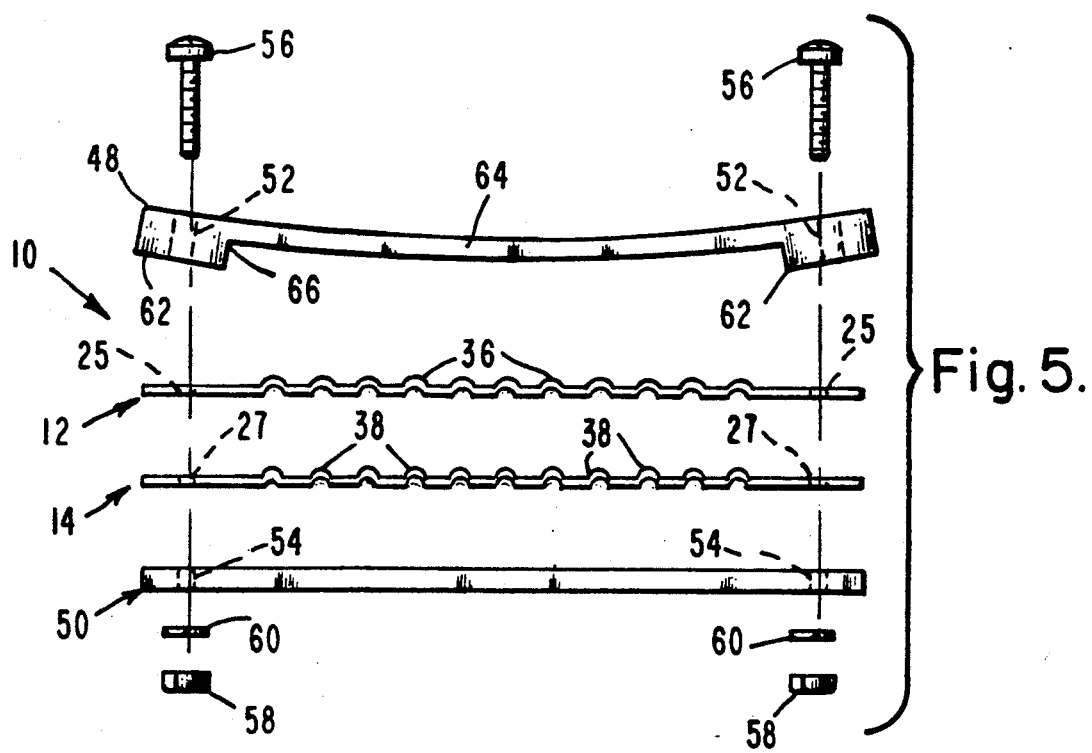
FIG. 5 is an exploded view of a first embodiment of the present invention incorporated in a pair of flexible flat cables.
Figure 7:
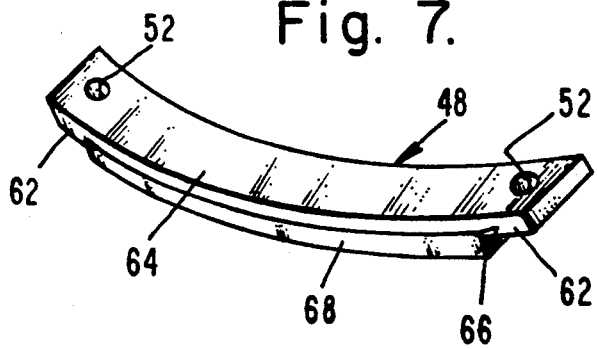
FIG. 7 is an isometric view of a hold down plate shown in FIGS. 1 and 5 illustrating a variation of the present invention employing a yieldable pressure pad.

Plate 48 is configured in a bowed fashion, such as shown in FIGS. 5 and 7, and is formed from a resilient but hard material such as stainless steel and beryllium copper alloy. Plate 48 includes a pair of end portions 62 and an intermediary portion 64 joining end portions 62. End portions 62 are relatively thicker than intermediary portion 64 so as to define a recess 66. Recess 66 is so configured as to receive and enclose cables 12 and 14 over their areas 28 and 30 of exposed termini 32 and 34 of conductors 20 and 22.

For such applications where, for example, dimensional tolerances and large temperature excursions are not important factors and where low cost may be an important factor, a resilient pad 68, for example, of elastomeric material, as shown in FIG. 7, may be positioned within recess 66 to press against flex cable 12 and to resiliently urge dimples 36 of cable 12 into good mechanical and electrical contact with dimples 38 of cable 14. For high technology applications, such as for military and space use, the use of a resilient pad 68 may not be acceptable, as not being capable of remaining resilient through extreme temperature variations. Therefore, pad 68 may be omitted and the dimensions of end portion 62 of plate 48 with respect to its intermediary portion 64 and the combined thickness of cables 12 and 14, including their dimples 36 and 38, may be precisely dimensioned to provide a space for the dimples, which space is sufficient to enable the mating dimples to be resiliently placed in contact with each other but not to cause the exertion of such pressure on the dimples as to deform them beyond their elastic limit. In both cases, whether resilient pad 68 is used or high dimensioning of plate 48 is employed, by avoiding an over-stressing of the dimples beyond their elastic limit, connector assembly 10 may be repeatedly assembled and disassembled and thus will be reusable for repeated connection and disconnection between cables 12 and 14 and their dimples 36 and 38.

Figure 6:
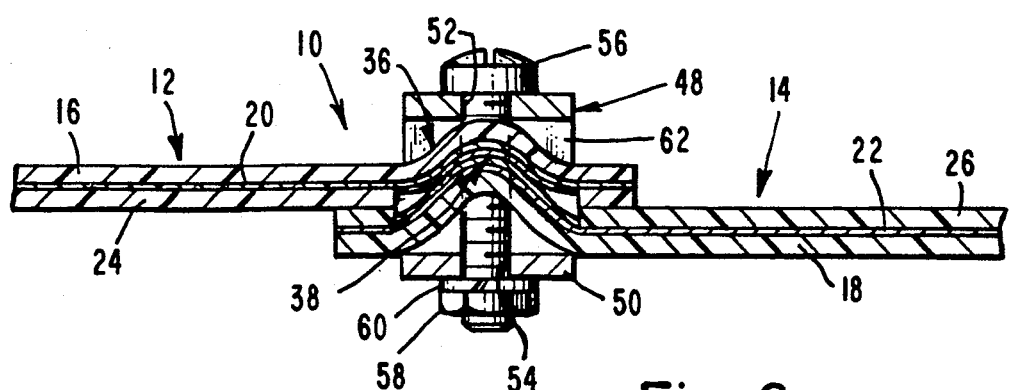
FIG. 6 is a view of the assembly depicted in FIGS. 1 and 5 in its coupled together fashion.

Plate 48 is curved or bowed so that, when assembly 10 is assembled as illustrated in FIG. 6, plate 48 and its intermediary portion 64, in particular, will exert a uniform contact and pressure over all dimples, whether positioned adjacent to end portions 62 or centrally of intermediary portion 64.

Figure 8:
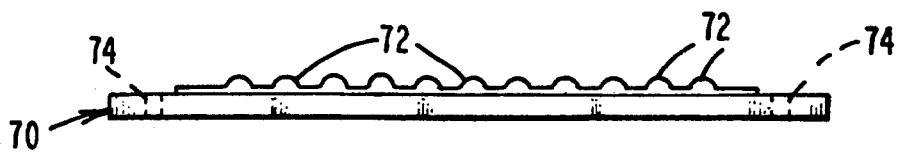
FIG. 8 is a view of a second embodiment of the present invention showing a rigid printed circuit board used in place of the lower flex cable and its supporting plate illustrated in FIGS. 1, 4 and 5.

As shown in FIG. 8, the electrical connection can be made also to a rigid printed wiring board 70 rather than to flexible cable 14 and its support plate 50 or, if applicable, in addition to flexible cable 14. This replacement or addition permits a connection to be made between a flexible and rigid printed wiring board rather than simply between a pair of flexible cables. As shown, rigid printed wiring board 70 includes a plurality of dimples 72 which, in this embodiment, conventionally comprise solid pads of gold plated copper or other suitable composition which are provided with a convex shape similar to that of dimples 38, so that they will mate with dimples 36 of a flex cable 12. If a connection to flexible cable 14 is also made, additional electrically conductive contact areas must be formed on concave side 46 of this cable, as well as on its convex side 42, with suitable electrical connections between its convex and concave sides 42 and 46. A pair of holes 74 are positioned in the ends of printed wiring board 70 and are alignable with holes 52 of plate 48 so that the flexible cable may be coupled to printed wiring board 70 and secured thereto by a similar connection scheme, such as by screws 56, nuts 58 and lock washers 60.

Although the invention has been described with respect to particular embodiments thereof, it should be realized that various changes and modifications may be made therein without departing from the scope of the invention.

What is claimed is:

1. An electrical connector assembly comprising:
   a plurality of electrical connectors, each including matable surfaces and a plurality of electrical conductors having termini terminating respectively on said surfaces;
   dimples on said conductor termini and respectively configured with matable surfaces of concave and convex configurations to provide conforming concave-convex contacts with one another for electrically coupling said electrical conductors respectively of said electrical connectors, wherein said dimples on mating ones of said conductors on said connectors are paired in contact with one another for effecting a self-alignment of said conductors; and
   a plate extending over said dimples on a first of said connectors and means associated with a second of said connectors and mechanically coupled to said plate for securing said connectors together and for maintaining the contact between said mating dimples.

2. An electrical connector according to claim 3 in which said electrical connectors comprise a pair of flexible flat cables and each of said dimples on each of said cables comprises a depression having concave and convex surfaces.

3. An electrical connector according to claim 3 in which a first of said electrical connectors comprises a flexible flat cable whose dimples comprise depressions having concave and convex surfaces, and a second of said electrical connectors comprises a rigid printed wiring board whose dimples comprise pads having convex surfaces.

4. An electrical connector according to claim 1 wherein said plate includes a pair of relatively thicker end portions and a thinner intermediary portion for defining a recess extending over and into contact with said dimples on said first connector, for urging said first connector dimples into the contact with said second connector dimples and for maintaining the contact therebetween.

5. An electrical connector according to claim 4 in which said plate is formed from a resilient material and is curved to provide a convex side facing said first connector dimples for ensuring complete and uniform contact therewith and uniform engagement between said mating dimples.

6. An electrical connector according to claim 4 in which said thicker and thinner portions are so dimensioned as to provide a space for protecting said dimples from being stressed beyond their elastic limit.

7. An electrical connector according to claim 4 further comprising a resilient pad positioned between said intermediary portion and said first connector dimples for exerting a resilient bias thereagainst and for protecting said dimples from being stressed beyond their elastic limit.

8. A method for forming an electrical connector assembly between a plurality of electrical connectors, each having matable surfaces and a plurality of electrical conductors having termini terminating respectively on the surfaces, comprising the steps of:

providing the conductor termini with dimples; and configuring the dimples with mating concave-convex surfaces in contact with one another and pairing the dimples on mating ones of the conductors on the first and second connectors for electrically coupling the electrical conductors respectively of the electrical connectors and enabling self-alignment among the conductors; and utilizing a curved plate of resilient material having concave and convex sides, positioning the convex side of the curved plate against the dimples of one of the connectors when fastening the connectors together, and flattening the plate against the one conductor for ensuring complete and uniform contact therewith and uniform engagement between the mating dimples.

9. A method according to claim 8 further comprising the step of providing a recess in the plate for receiving the conductors therein.

* * * * *